(12) United States Patent
Dhuey

(10) Patent No.: US 6,924,568 B2
(45) Date of Patent: Aug. 2, 2005

(54) QUIET FAN SPEED CONTROL

(75) Inventor: Michael J. Dhuey, Cupertino, CA (US)

(73) Assignee: Apple Computer, Inc., Cupertino, CA (US)

( * ) Notice: Subject to any disclaimer, the term of this patent is extended or adjusted under 35 U.S.C. 154(b) by 198 days.

(21) Appl. No.: 10/214,414

(22) Filed: Aug. 6, 2002

(65) Prior Publication Data

US 2004/0027763 A1 Feb. 12, 2004

(51) Int. Cl.[7] .............................................. H01H 35/00
(52) U.S. Cl. ...................................................... 307/130
(58) Field of Search ........................... 361/103; 307/82, 307/52, 117, 130, 139, 119

(56) References Cited

U.S. PATENT DOCUMENTS

| | | | | |
|---|---|---|---|---|
| 5,929,581 A | * | 7/1999 | Van Brocklin et al. | 318/471 |
| 5,990,582 A | * | 11/1999 | Henderson et al. | 307/139 |
| 6,182,902 B1 | * | 2/2001 | Shih | 236/35 |
| 6,239,991 B1 | * | 5/2001 | Ajro et al. | 363/41 |
| 6,590,356 B2 | * | 7/2003 | Smith et al. | 318/254 |
| 6,617,709 B2 | * | 9/2003 | Yu | 307/119 |

* cited by examiner

Primary Examiner—Brian Sircus
Assistant Examiner—Boris Benenson
(74) Attorney, Agent, or Firm—Henneman & Saunders; Larry E. Henneman, Jr.

(57) ABSTRACT

A novel a circuit for driving a fan includes an output terminal for supplying the fan with drive power, a pulse width modulation driver, and a limiter. A first power terminal of the fan is held at a first voltage (e.g., 0V), and a second power terminal of the fan is coupled to the output terminal of the driver circuit. The PWM driver provides a series of fan drive pulses on the output terminal, and the limiter prevents the voltage on the output terminal from falling below a predetermined voltage. The predetermined voltage is greater than the first voltage at which the fan's first power terminal is held, and is sufficient to keep the fan in motion even when the duty cycle of the PWM signal is 0%. In a particular embodiment the limiter includes a voltage clamp. In a more particular embodiment, the voltage clamp is a diode. In another particular embodiment, the limiter includes a switch for combining a PWM signal with a DC voltage at an output.

12 Claims, 3 Drawing Sheets

QUIET FAN SPEED CONTROL

BACKGROUND OF THE INVENTION

1. Field of the Invention

This invention relates generally to electronic control of cooling fans, and more particularly to a system and method for reducing undesirable noise resulting from driving a fan with pulse width modulation.

2. Description of the Background Art

It is common practice to regulate the speed of fans used to cool electronic components such as computers. Regulating the speed of fans increases fan life, decreases noise caused by unnecessarily high airflow, and conserves electrical energy.

One common method of controlling fan speed is to drive the fan using low frequency pulse width modulation (PWM). According to PWM, electrical power is supplied to the fan in a series of pulses. The fan's speed is controlled by controlling the width (duration) of the pulses. The percentage of time that a pulse is being applied to the fan is referred to as the "duty cycle." When the pulses are wide (high duty cycle), the fan speed is correspondingly high. When the duty cycle decreases (relatively narrower pulses), the fan speed correspondingly decreases.

Although PWM has proven to be one of the most efficient methods of controlling fan speed, objectionable noise, commonly referred to as "growling", is generated when the duty cycle is reduced below approximately 30 percent. Typically, the noise occurs at a frequency equal to the PWM, and is especially noticeable when using high operating current fans, and low operating speeds. Accordingly, fan control circuits commonly require that the fan be driven with at least 30% PWM duty cycle, which may be faster than necessary or desirable for quiet operation.

What is needed, therefore, is a system and method for using PWM to drive a fan at low duty cycles, without causing growling noise. What is also needed is a system and method for using PWM to drive a fan at speeds lower than speeds corresponding to a 30 percent duty cycle.

SUMMARY

The present invention overcomes the problems associated with the prior art by providing a system and method for generating a fan drive voltage that pulses between a non-zero base voltage and a peak drive voltage. The invention facilitates driving a fan with pulse width modulation (PWM) at low duty cycles, without producing undesirable "growling" noise.

In one embodiment, a circuit for driving a fan includes an output terminal for supplying the fan with drive power, a pulse width modulation driver, and a limiter. A first power terminal of the fan is held at a first voltage (e.g., 0V), and a second power terminal of the fan is coupled to the output terminal of the driver circuit. The PWM driver provides a series of fan drive pulses on the output terminal, and the limiter prevents the voltage on the output terminal from falling below a predetermined voltage. The predetermined voltage is greater than the first voltage at which the fan's first power terminal is held.

In a particular embodiment, the limiter is a voltage clamp coupled to the output terminal. In a more particular embodiment, the limiter includes a diode coupled between a DC voltage source and the output terminal. Optionally, the limiter includes a plurality of diodes, and a plurality of bypass elements, each bypass element coupled in parallel with an associated one of said diodes. The bypass elements facilitate the selective activation of each diode, which in turn facilitates the selection of one of a plurality of DC voltages for the predetermined voltage.

In another particular embodiment, the limiter includes a switch, and is operative to combine a DC voltage with a PWM drive by selectively asserting either the DC voltage or the PWM drive on the output terminal of the fan driver circuit.

A method of quietly driving a fan is also described. The method includes the steps of providing a PWM drive output, combining the PWM drive output with a DC voltage, and providing the combined drive signal at an output. The value of the DC voltage is selected to be sufficient to keep the fan in motion even when the duty cycle of the PWM drive output is 0%.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a system and method for driving a cooling fan using a constrained pulse width modulation (PWM) drive output. In the following description, numerous specific details are set forth (e.g., particular voltages, polarities, circuit configurations, etc.) in order to provide a thorough understanding of the invention. Those skilled in the art will recognize, however, that the invention may be practiced apart from these specific details. In other instances, details of well known electronics practices (e.g., controlling a conventional PWM output) and components have been omitted, so as not to unnecessarily obscure the present invention.

Figure 1:
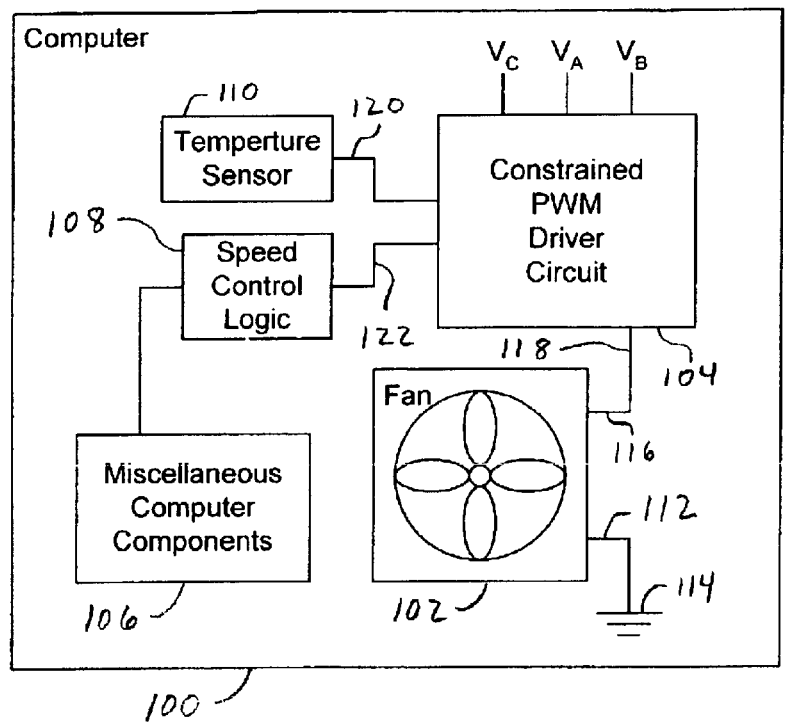
FIG. 1 is a block diagram of a computer system using quiet fan speed control according to the present invention.

FIG. 1 is a block diagram of a computer 100, including a fan 102, a constrained PWM driver circuit 104, miscellaneous computer components 106, speed control logic 108, and sensor 110. Fan 102 provides cooling for computer 100, by moving air out of computer 100. The moving air carries away heat generated by miscellaneous computer components 106, which include, for example, a motherboard, hard drives, removable media drives, a monitor, etc..

The speed of fan 102 is controlled by constrained PWM driver circuit 104. Fan 102 has a first power terminal 112 coupled to a first voltage source 114, and a second power terminal 116 coupled to an output terminal 118 of driver circuit 104. In this example, voltage source 114 is ground, but this is not a requirement of the invention.

Driver circuit 104 provides an advantage over conventional PWM driver circuits, because driver circuit 104 provides a pulsed voltage at its output 118 that has a base voltage that is higher than that provided by first voltage source 114. In contrast, conventional PWM drivers typically operate at a base voltage equal to the voltage being asserted on first power terminal 112 by first voltage source 114. In other words, a conventional PWM driver would pulse fan 102 between an "off" state and a "on" state, whereas driver circuit 104 pulses fan 102 between a "partially on" state and an "on" state. Because fan 102 is always at least partially on, undesirable "growling" noise is eliminated even when fan 102 is driven at a low duty cycle. Indeed, the duty cycle of the output of driver circuit 104 can be 0%, because the base voltage keeps fan 102 running at a minimum speed. Driver circuit 104 can then add voltage pulses from 1% to 100% duty cycle, to increase the speed of fan 102 from the minimum speed provided by the base voltage to a maximum speed.

The width (duration) of the pulses provided by driver circuit 104 control the speed of fan 102. Driver circuit 104 determines the appropriate width (duty cycle) of the pulses based on input from temperature sensor 110 and/or control logic 108. For example, in response to sensor 110 providing a signal, via line 120, indicating a relatively high temperature, driver circuit 104 will increase the duty cycle, and thus the speed of fan 102. If, however, the signal from sensor 110 indicates a relatively low temperature, then driver circuit 104 will reduce the duty cycle, thereby lowering the speed of fan 102, eliminating unnecessary airflow noise, and conserving energy. Optionally, speed control logic 108 provides a speed control signal, via line 122, to driver circuit 104 based on some other criteria, for example computer 100 being placed in an inactive state.

Figure 2:
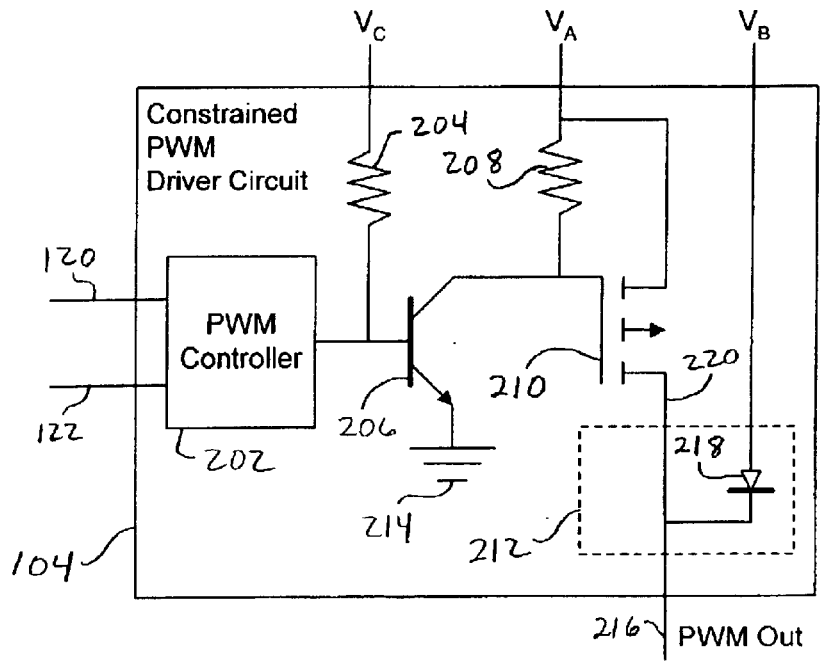
FIG. 2 is a block diagram showing the constrained PWM driver circuit of the computer system of FIG. 1 in greater detail.

FIG. 2 is a block diagram showing PWM driver circuit 104 in greater detail to include a PWM control circuit 202, a first resistor 204, a first transistor 206, a second resistor 208, a second transistor 210, a base voltage limiter 212, a first voltage source 214 (gnd), a second voltage source $V_A$, a third voltage source $V_B$, a fourth voltage source $V_C$, and an output terminal 216. Base voltage limiter 212 includes a diode 218 coupled between third voltage source $V_B$ and output terminal 216. The output of PWM controller 202 is coupled to the control terminal (base) of transistor 206, and is coupled to voltage source VC via resistor 204. One conduction terminal (collector) of transistor 206 is coupled to the control terminal (gate) of transistor 210, and is coupled via resistor 208 to voltage source VA. The other conduction terminal (emitter) of transistor 206 is tied to ground 214. One conduction terminal (drain) of transistor 210 is coupled directly to voltage source VA, and the other conduction terminal (source) is coupled to output terminal 216. Output terminal 216 is also coupled to voltage source VB via diode 218.

In this particular embodiment, PWM control circuit 202 is a conventional PWM integrated circuit chip, resistor 204 is a 10K ohm resistor, transistor 206 is an NPN transistor, resistor 208 is a 10K ohm resistor, transistor 210 is a P channel FET, diode 218 is a shottky diode, VA=12V, VB=5V, and VC=3.3V. These voltages were selected, at least in part, because 3.3V is a typical integrated circuit operating voltage, and typical fans operate in the range of 4V–12V. It should be understood, however, that the invention is not limited to the use these particular components and voltages. In fact, it is expected that the invention may be practiced with a wide range of components and voltages depending on the particular type of fan and other application specifics.

Figure 3:
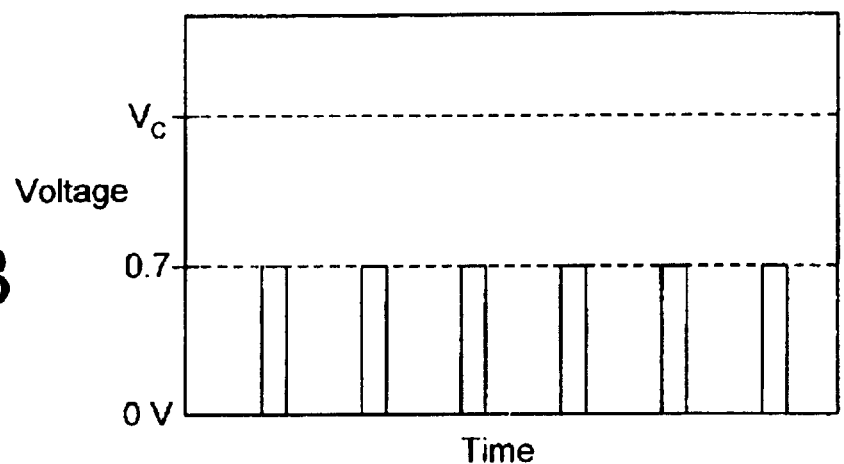
FIG. 3 is a graph showing the output of the PWM controller shown in FIG. 2.

The operation of driver circuit 104 will be explained with reference to FIGS. 2–5. FIG. 3 is a graph showing the voltage at the output of PWM controller 202 and the base of transistor 206 as a function of time. PWM controller 202 provides conventional PWM output, varying the pulse width of the output based on control input received via lines 120 and 122. When the output of PWM controller 202 rises to 0.7 volts, the base of transistor 206 conducts, thus limiting the voltage on the base to 0.7 volts. PWM controller 202 maintains the 0.7 voltage output for a time period corresponding to the desired duty cycle, after which PWM controller pulls its output to ground (0V). Thus, the output of PWM controller 202 is pulsed between a base voltage of 0V and a peak voltage of 0.7V. The frequency of the pulsed output provided by PWM controller remains constant. The duty cycle is changed by modulating the duration (width) of the pulses. The duration of the pulses shown in FIG. 3 correspond to approximately a 25% duty cycle.

Figure 4:
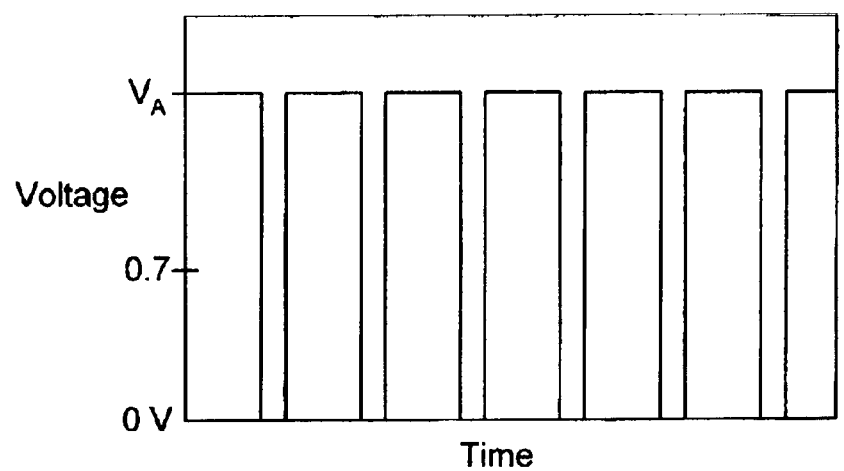
FIG. 4 is a graph showing the voltage at one node of the circuit of FIG. 2.

FIG. 4 is a graph showing the voltage on the gate of transistor 210. When the output of PWM controller 202 is 0V, transistor 206 is nonconducting, and resistor 208 pulls the voltage on the gate of transistor 210 up to the voltage of voltage source $V_A$. When the output of PWM controller 202 transitions to 0.7 volts, transistor 206 goes into conduction and pulls the gate of transistor 210 to ground 214. Thus, the voltage on the gate of transistor 210 pulses between a base voltage of 0V and a peak voltage of $V_A$. Note that the pulsed voltage on the gate of transistor 210 is inverted as compared to the pulsed output of PWM controller 202. In particular, when the output of PWM controller 202 is at 0V, the gate of transistor 210 is at $V_A$. When the output of PWM controller 202 is at 0.7V, the gate of transistor 210 is at 0V.

Figure 5:
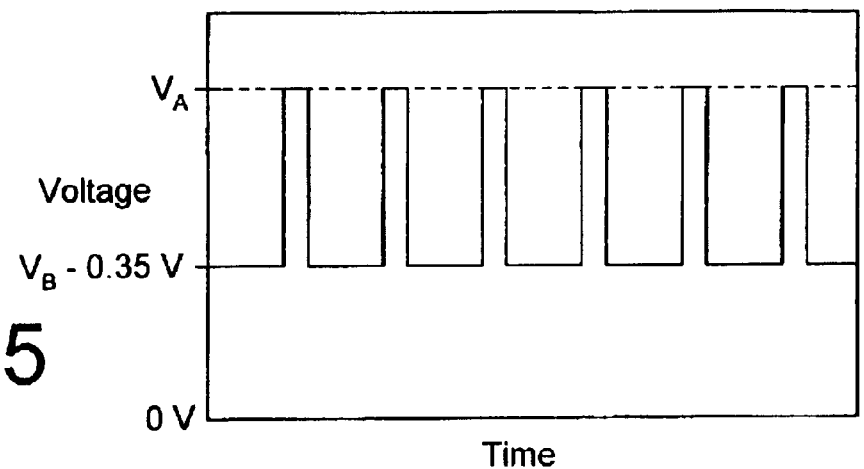
FIG. 5 is a graph showing the output of the constrained PWM driver circuit of FIG. 2.

FIG. 5 is a graph showing the voltage on the output of PWM driver circuit 104. When the voltage on the gate of transistor 210 is at $V_A$, transistor 210 is nonconductive, and the voltage on output terminal 216 is pulled low, because output terminal 216 is coupled to ground through fan 102. However, when the voltage on output terminal 216 goes low enough, diode 218 conducts, clamping the voltage on output terminal 216 at a voltage one diode drop (0.35V) below VB. When the voltage on the gate of transistor 210 is at 0V, transistor 210 is conductive, and the voltage on output terminal 216 increases to $V_A$. Thus, driver circuit 104 provides a pulsed modulation voltage on output terminal 216 that pulses between a base voltage (VB-0.35V) and the maximum driving voltage $V_A$. Note that the base voltage is sufficiently greater than the voltage (0V) tied to first power terminal 112 of fan 102 to keep fan 102 operating.

Without limiter 212, the source terminal 220 of transistor 210 would produce an ordinary PWM drive output that pulses between a base voltage of 0V and a peak voltage of $V_A$, and growling noise would be produced when fan 102 is driven at a low duty cycle. However, because limiter 212 combines a DC voltage with the ordinary PWM drive output of transistor 210, fan 102 can be driven at a low duty cycle without producing objectionable growling noise. For example, in this example, limiter 212 clamps the voltage on output terminal 216 so that it cannot fall below a base voltage of VB-0.35V, or approximately 4.65V. This minimum DC base voltage is sufficient to quietly spin fan 102 at a minimum speed, thereby allowing the addition of low duty cycle PWM pulses without causing growling noise. Note that the minimum fan speed produced by the base voltage is far lower (approximately a factor of three) than the speed resulting from a 30% duty cycle used in prior art PWM drivers to eliminate the growling noise.

Figure 6:
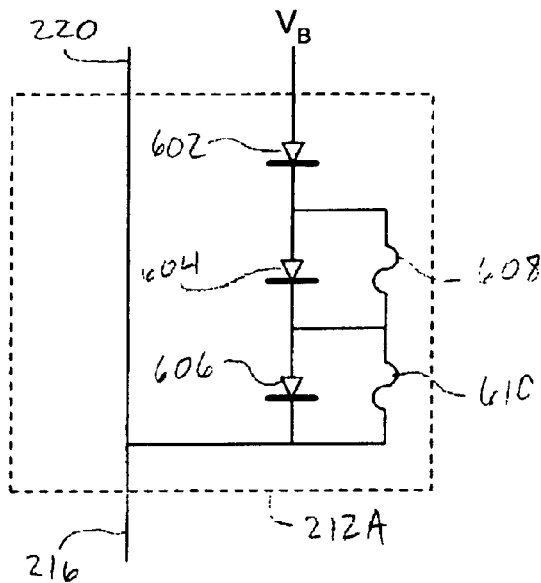
FIG. 6 is a diagram showing an alternate voltage combiner.

FIG. 6 is a diagram of an alternate limiter 212A that provides for the adjustment/selection of the base voltage added to the PWM output, and therefore provides for the adjustment/selection of the minimum operating speed of fan 102. Alternate limiter 212A includes a plurality (3 in this example) of diodes 602, 604, and 606 coupled in series between voltage source VB and output terminal 216. Diodes 602, 604, and 606 are shottky diodes, each producing a voltage drop of about 0.35V when conducting. Limiter 212A further includes a first fused link 608 coupled in parallel with diode 604, and a second fused link 610 coupled in parallel with diode 606.

Fused links 608 and 610 function as bypass elements which prevent conduction by diodes 604 and 606, respectively. When fused links 608 and 610 are intact, no voltage drop is produced by diodes 604 and 606, and diode 602 prevents the voltage on output terminal 216 from falling below VB-0.35V, the same as in limiter 212 of FIG. 2. However, fused links 608 and 610 are selectively interruptible. When one of fused links 608 and 610 is interrupted, the respective one of diodes 604 and 606 conducts, producing a corresponding voltage drop. If both of fused links 608 and 610 are interrupted, then both of diodes 604 and 606 conduct, and produce corresponding voltage drops.

A user can therefore select between three different DC voltages to combine with the PWM output being provided by source terminal 220. If neither of links 608 and 610 are interrupted, then the voltage on source terminal 220 and output terminal 216 is clamped at VB-0.35V. If one of links 608 and 610 are interrupted, then the voltage on source terminal 220 and output terminal 216 is clamped at VB-0.7V. If both of links 608 and 610 are interrupted, then the voltage on source terminal 220 and output terminal 216 is clamped at VB-1.05V. If VB is at 5V, then limiter 212A provides for the selection of 4.65V, 4.3V, or 3.95V for a base output voltage. It should be noted that a greater number of diodes (and associed bypass elements) can be connected in series to provide a wider selection of base voltages. Further adjustment of the base voltage can also be provided by regulating the voltage provided by voltage source VB.

Links 608 and 610 can be interrupted in various ways. For example, they can be traces on a printed circuit board which can be selectively scratched by an assembler. Another example would be to use fused links that can be blown with laser light, electrical current, etc. Yet another example would be to use 0 ohm resistors or jumper wires that can be selectively removed. In yet another example, the number of diodes to use can be determined at the assembly stage, and unrequired diodes can be omitted and replaced with 0 ohm resistors.

Figure 7:
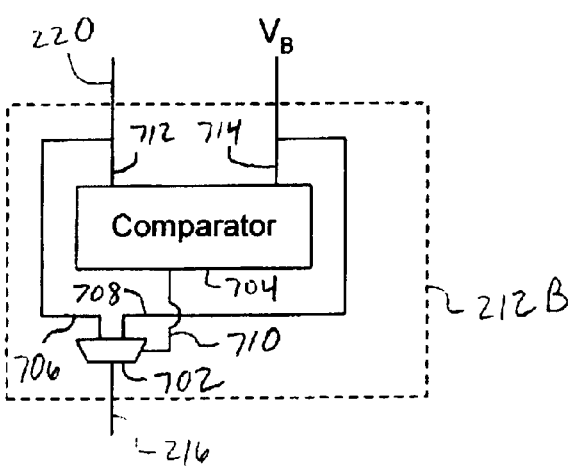
FIG. 7 is a diagram showing another alternate voltage combiner.

FIG. 7 is a diagram of another alternative limiter 212B. Limiter 212B uses switching to combine the PWM output provided on source terminal 220 with the DC voltage provided by voltage source VB. Alternate limiter 212B includes a multiplexer 702 and a comparator 704. Multiplexer 702 includes a first input terminal 706 coupled to source terminal 220, a second input terminal 708 coupled to DC voltage source VB, and a control terminal 710. Comparator 704 also includes a first input terminal 712 coupled to source terminal 220, and a second input terminal 714 coupled to DC voltage source VB. The output of comparator 704 is asserted on control terminal 710 of multiplexer 702.

Responsive to the output of comparator 704 being asserted on its control terminal, multiplexer 702 selectively couples either the PWM signal on terminal 220 or the DC voltage from source VB with output terminal 216. Comparator 704 compares the PWM signal with the voltage provided by voltage source VB. If the voltage of the PWM signal falls below VB, then comparator 212B asserts a signal on control terminal 710 causing multiplexer to coupled the second input terminal 708 with output terminal 216, thereby preventing the voltage on output terminal 216 from falling below VB. When the PWM signal is above VB, however, comparator 704 asserts another signal on control terminal 710, causing multiplexer 702 to couple source terminal 220 with output terminal 216. Thus, alternate limiter 212B produces an output similar to that shown in FIG. 5, except that the base voltage of the pulsed output is VB instead of VB-0.35V.

Alternate limiter 212B is shown to illustrate that a base DC voltage can be combined with the PWM drive signal via switching. Virtually any switch (e.g., switching transistors) capable of switching between the PWM signal and the DC base voltage, when the PWM signal goes lower than the base voltage, can be employed.

Figure 8:
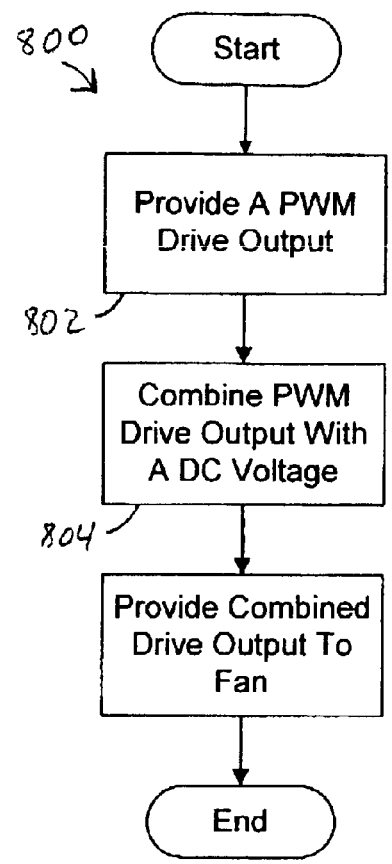
FIG. 8 is a flowchart summarizing one method of using pulse width modulation to drive a fan according to the present invention.

FIG. 8 is a flow chart summarizing one method 800 for controlling a fan according to the present invention. In a first step 802, a PWM output is provided. In a second step 804, the PWM output is combined with a DC voltage. Then, in a third step 806, the combined PWM/DC drive output is provided to a fan, to quietly drive the fan at a speed dependent on the PWM component of the output, but not slower than a minimum speed determined by the DC voltage component. This method facilitates driving a fan with low duty cycle PWM output, without generating undesirable growling noise from the fan.

The description of particular embodiments of the present invention is now complete. Many of the described features may be substituted, altered or omitted without departing from the scope of the invention. For example, the circuits described herein may operate at voltages and polarities other than those set forth herein. As another example, a voltage between the base voltage and the peak voltage can be used to trigger the switching between the PWM drive output and the DC base voltage. As another example, (referring to FIG. 2) the gate of transistor 210 could be precisely driven to provide a drive signal similar to that shown in FIG. 5, thus eliminating the need for limiter 212. However, this approach requires that the transistors be driven in the linear region, and results in greater power consumption and heat generation. These and other deviations from the particular embodiments shown will be apparent to those skilled in the art, particularly in view of the foregoing disclosure.

I claim:

1. A computer comprising:
   a first voltage source for providing a first voltage;
   a fan having a first power terminal and a second power terminal, said first power terminal coupled to said first voltage source, and
   a fan driver circuit having an output coupled to said second power terminal of said fan, said driver circuit operative to provide a pulsed modulation voltage at said output, said pulsed modulation voltage pulsing between a base voltage and a second voltage, said base voltage being intermediate said first voltage and said second voltage, said fan driver circuit including
      a pulse width modulation driver having an output coupled to said output of said fan driver circuit;

a third voltage source for providing a DC voltage between said base voltage and said second voltage;

a clamp coupled to said output of said fan driver circuit for preventing said output of said fan driver circuit from falling below said base voltage, said clamp including a plurality of diodes coupled in series between said third voltage source and said output of said fan driver circuit.

2. A computer according to claim 1, wherein said base voltage is greater than said first voltage.

3. A computer according to claim 1, wherein the difference between said first voltage and said base voltage is sufficient to operate said fan.

4. A computer according to claim 1, wherein said clamp further includes a plurality of diode bypass elements, each diode bypass element coupled in parallel with a respective one of said diodes.

5. A computer according to claim 4, wherein said diode bypass elements are selectively interruptible.

6. A computer according to claim 1, wherein said base voltage is closer in value to said first voltage than to said second voltage.

7. A computer comprising:

a first voltage source for providing a first voltage;

a fan having a first power terminal and a second power terminal, said first power terminal coupled to said first voltage source, and a fan driver circuit having an output coupled to said second power terminal of said fan, said driver circuit operative to provide a pulsed modulation voltage at said output, said pulsed modulation voltage pulsing between a base voltage and a second voltage, said base voltage being intermediate said first voltage and said second voltage; and wherein said fan driver circuit includes a pulse width modulation controller for providing a pulse width modulation signal at an output;

a third voltage source for providing a third voltage greater than said first voltage and less than said second voltage;

a resistor coupled between said third voltage source and said output of said pulse width modulation controller;

a first transistor having a control terminal coupled to said output of said pulse width modulation controller, a first conduction terminal coupled to said first voltage source, and a second conduction terminal;

a second voltage source for providing said second voltage;

a second resistor coupled between said second voltage source and said second conduction terminal of said first transistor;

a second transistor having a control terminal coupled to said second conduction terminal of said first transistor, a first conduction terminal coupled to said second voltage source, and a second conduction terminal coupled to said output of said fan driver circuit;

a fourth voltage source for providing a fourth voltage greater than said base voltage and less than said second voltage; and a diode coupled between said fourth voltage source and said output of said fan driver circuit.

8. A circuit for driving a fan, said fan including a first power terminal held at a first voltage, said circuit comprising:

an output terminal for supplying said fan with drive power;

a pulse width modulation driver for providing a series of fan drive pulses on said output terminal;

a DC voltage source; and a voltage clamp coupled to said output terminal, said voltage clamp including a plurality of diodes coupled in series between said DC voltage source and said output terminal, said voltage clamp operative to prevent the voltage on said output terminal from falling below a predetermined voltage greater than said first voltage.

9. A circuit according to claim 8, wherein said clamp further includes a plurality of diode bypass elements, each diode bypass element coupled in parallel with a respective one of said diodes.

10. A circuit according to claim 9, wherein said diode bypass elements are selectively interruptible.

11. A circuit according to claim 8, wherein:

said DC voltage source provides a DC voltage; and said voltage clamp is operative to combine said DC voltage with said series of fan drive pulses.

12. A circuit according to claim 8, wherein said predetermined voltage is closer in value to said first voltage than to a voltage corresponding to an "on" value of said fan drive pulses.

* * * * *